(12) United States Patent
Kushima et al.

(10) Patent No.: US 9,538,674 B2
(45) Date of Patent: Jan. 3, 2017

(54) HOUSING OF ELECTRONIC DEVICE

(75) Inventors: Hajime Kushima, Toyota (JP); Hiroaki Yuasa, Nisshin (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 0 days.

(21) Appl. No.: 14/004,862

(22) PCT Filed: Mar. 17, 2011

(86) PCT No.: PCT/JP2011/056384
§ 371 (c)(1),
(2), (4) Date: Sep. 12, 2013

(87) PCT Pub. No.: WO2012/124101
PCT Pub. Date: Sep. 20, 2012

(65) Prior Publication Data
US 2014/0060918 A1   Mar. 6, 2014

(51) Int. Cl.
| | |
|---|---|
| H05K 5/00 | (2006.01) |
| H05K 5/02 | (2006.01) |
| H02K 5/24 | (2006.01) |
| H01F 27/02 | (2006.01) |
| H01F 27/26 | (2006.01) |
| H01F 27/30 | (2006.01) |
| H01F 27/33 | (2006.01) |

(52) U.S. Cl.
CPC ............ *H05K 5/0217* (2013.01); *H01F 27/02* (2013.01); *H02K 5/24* (2013.01); *H01F 27/266* (2013.01); *H01F 27/306* (2013.01); *H01F 27/33* (2013.01)

(58) Field of Classification Search
CPC ...... H01F 27/266; H01F 27/02; H01F 27/306; H01F 27/33; H02K 5/24; H05K 5/0217

USPC ......................... 174/520; 336/65; 361/679.34
See application file for complete search history.

(56) References Cited

U.S. PATENT DOCUMENTS

| | | | | |
|---|---|---|---|---|
| 4,360,838 A | * | 11/1982 | Babicz et al. ............... | 348/826 |
| 6,067,708 A | * | 5/2000 | Wong et al. ................ | 29/832 |
| 6,166,783 A | * | 12/2000 | Ahn ............................ | 348/836 |
| 2008/0159848 A1 | * | 7/2008 | Liu .............................. | 415/108 |

FOREIGN PATENT DOCUMENTS

| | | |
|---|---|---|
| EP | 0005303 A2 | 11/1979 |
| JP | 1-158024 U | 10/1989 |
| JP | 4-46635 U | 4/1992 |
| JP | 2006-292312 A | 10/2006 |
| JP | 2007-180140 A | 7/2007 |
| JP | 2007-180145 A | 7/2007 |
| JP | 2008-300786 A | 12/2008 |
| JP | 2009-168344 A | 7/2009 |

* cited by examiner

*Primary Examiner* — Jinhee Lee
*Assistant Examiner* — James Wu
(74) *Attorney, Agent, or Firm* — Sughrue Mion, PLLC (57) ABSTRACT

There is provided an electrical device's casing capable of reducing vibration generated by the electrical device while the device is operating. A converter case (10) encasing a reactor which generates vibration while operating includes: a plate-shaped base (12) having a front surface and a rear surface, the reactor being to be mounted on the front surface; a reactor case (30) erected from the front surface of the base (12) and surrounding an outer periphery of the reactor; a reinforcing portion (40) provided outside the reactor case (30) and configured to increase stiffness of the base (12); and a rib (50) coupling the reactor case (30) and the reinforcing portion (40) to each other.

5 Claims, 5 Drawing Sheets

HOUSING OF ELECTRONIC DEVICE

CROSS REFERENCE TO RELATED APPLICATIONS

This application is a National Stage of International Application No. PCT/JP2011/056384 filed Mar. 17, 2011, the contents of all of which are incorporated herein by reference in their entirety.

TECHNICAL FIELD

The present invention relates to a housing of an electronic device, and particularly to a housing encasing an electrical device which generates vibration while operating.

BACKGROUND ART

In recent years, electrically-powered vehicles mounted with an electric motor (motor) incorporated in a drive unit, such as electric vehicle, hybrid vehicle, fuel cell vehicle and the like, have been developed and commercialized as environmentally-friendly vehicles. These electrically-powered vehicles are commonly mounted with a PCU (Power Control Unit) for controlling driving of the motor.

The PCU is constituted, for example, of a converter (constituted of a reactor and a switching circuit connected to the reactor), a capacitor, and an inverter. In the case where the PCU is mounted on an electrically-powered vehicle, the converter, the capacitor, and the inverter are housed in one case. A DC voltage from a DC power supply is transformed (boosted for example) by the reactor and the transformed DC voltage is supplied to the inverter to thereby drive the motor.

Regarding this reactor, a mount structure for holding a core in a reactor case is disclosed for example in Japanese Patent Laying-Open No. 2008-300786 (PTD 1). Japanese Patent Laying-Open No. 2008-300786 (PTD 1) discloses a mount structure for a reactor. Specifically, a combination of two plates is inserted in a gap between the reactor and the case, the two plates are a first plate for preventing the reactor from jumping off from the case and a second plate secured longitudinally and transversely to the first plate and secured to the case, and one of the two plates is secured to the case.

As to a rib for reinforcing a structure, a variety of techniques have conventionally been proposed. For example, Japanese Patent Laying-Open No. 2009-168344 (PTD 2) discloses a configuration for an indoor unit of an air conditioner. Specifically, a frame of an air filter includes a boss disposed at a central portion of the air filter, an annular outer frame disposed concentrically with the central point of the boss, an annular rib disposed between the boss and the outer frame and disposed concentrically with the central point of the boss, six longer ribs extending radially from the boss to the outer frame, and shorter ribs extending radially from at least the annular rib to the outer frame to separate the region between the longer ribs adjacent to each other into a plurality of regions.

Japanese Patent Laying-Open No. 2006-292312 (PTD 3) discloses, regarding a top-panel structure of an air conditioner to be installed at a high place, a technique for increasing the stiffness and the like. Specifically, the air conditioner to be installed at a high place includes a plurality of reinforcing ribs extending radially from near a substantially central portion where a fan motor is supported to a radially outer periphery where a heat exchanger is supported. The plurality of reinforcing ribs include a reinforcing rib protruding from the front side of the top panel and a reinforcing rib protruding from the back side thereof to thereby increase the stiffness and the like.

Japanese Utility Model Laying-Open No. 4-46635 (PTD 4) discloses a configuration for an air conditioner. Specifically, the air conditioner includes a screwing boss on a body which encases a heat exchanger, and the boss is mounted with an obliquely downward reinforcing rib. Japanese Utility Model Laying-Open No. 1-158024 (PTD 5) discloses a configuration for an air blower of a separate-type air conditioner. Specifically, ribs extending from a boss portion in four directions respectively are provided and spaces separated by these ribs are formed.

CITATION LIST

Patent Document

PTD 1: Japanese Patent Laying-Open No. 2008-300786
PTD 2: Japanese Patent Laying-Open No. 2009-168344
PTD 3: Japanese Patent Laying-Open No. 2006-292312
PTD 4: Japanese Utility Model Laying-Open No. 4-46635
PTD 5: Japanese Utility Model Laying-Open No. 1-158024

SUMMARY OF INVENTION

Technical Problem

The electrically-powered vehicle is required to offer comfortableness in the vehicle. However, while the reactor is operating, the distance between a plurality of reactor cores into which a reactor core is divided is changed or the individual core is deformed, which causes vibration. As for the above-described mount structure for a reactor disclosed in Japanese Patent Laying-Open No. 2008-300786 (PTD 1), the reactor case is secured to another member with bolts and vibration of the reactor is transmitted to the other member through the reactor case, resulting in a problem of its deteriorated vibration characteristic and increased noise.

The present invention has been made in view of the above problem, and a chief object of the invention is to provide a housing of an electrical device that can reduce vibration generated while the electrical device is operating.

Solution to Problem

The inventors of the present invention have conducted thorough studies on outward transmission of vibration generated from a reactor mounted on a vehicle. Consequently, it has been found that the vibration of the reactor is transmitted through a potting resin, which is injected for thermal conduction of the reactor, to the reactor case surrounding the reactor, which causes the reactor case to vibrate and accordingly causes the vibration to be transmitted to the outside. In view of this, the inventors of the present invention have reached a conclusion that the shape of the reactor case can be optimized to reduce vibration generated from the reactor, and accordingly made the present invention configured in the following manner.

Namely, a housing of an electrical device in accordance with the present invention is a housing encasing the electrical device which generates vibration while operating. The housing includes: a plate-shaped base having a front surface and a rear surface, the electrical device being to be mounted on the front surface; a surrounding wall erected from the front surface of the base and surrounding an outer periphery of the electrical device; a boss provided outside the surrounding wall and formed by a point-like protrusion of the base from the front surface or the rear surface; and a rib coupling the surrounding wall and the front surface of a position where the boss is formed to each other.

Regarding the housing of an electrical device, preferably the rib extends along a direction of vibration of the electrical device.

Regarding the housing of an electrical device, preferably the reinforcing portion is placed at a central portion of the electrical device with respect to a direction orthogonal to a direction of vibration of the electrical device.

Regarding the housing of an electrical device, preferably the ribs are formed to extend respectively from portions of the surrounding wall that are opposite to each other.

Regarding the housing of an electrical device, preferably the electrical device is a reactor mounted on a vehicle.

Advantages Effects of Invention

The housing of an electrical device in accordance with the present invention can reduce vibration generated while the electrical device is operating.

DESCRIPTION OF EMBODIMENTS

An embodiment of the present invention will be described hereinafter based on the drawings. In the drawings referenced below, the same or corresponding parts are denoted by the same reference numerals, and a description thereof will not be repeated.

Figure 1:
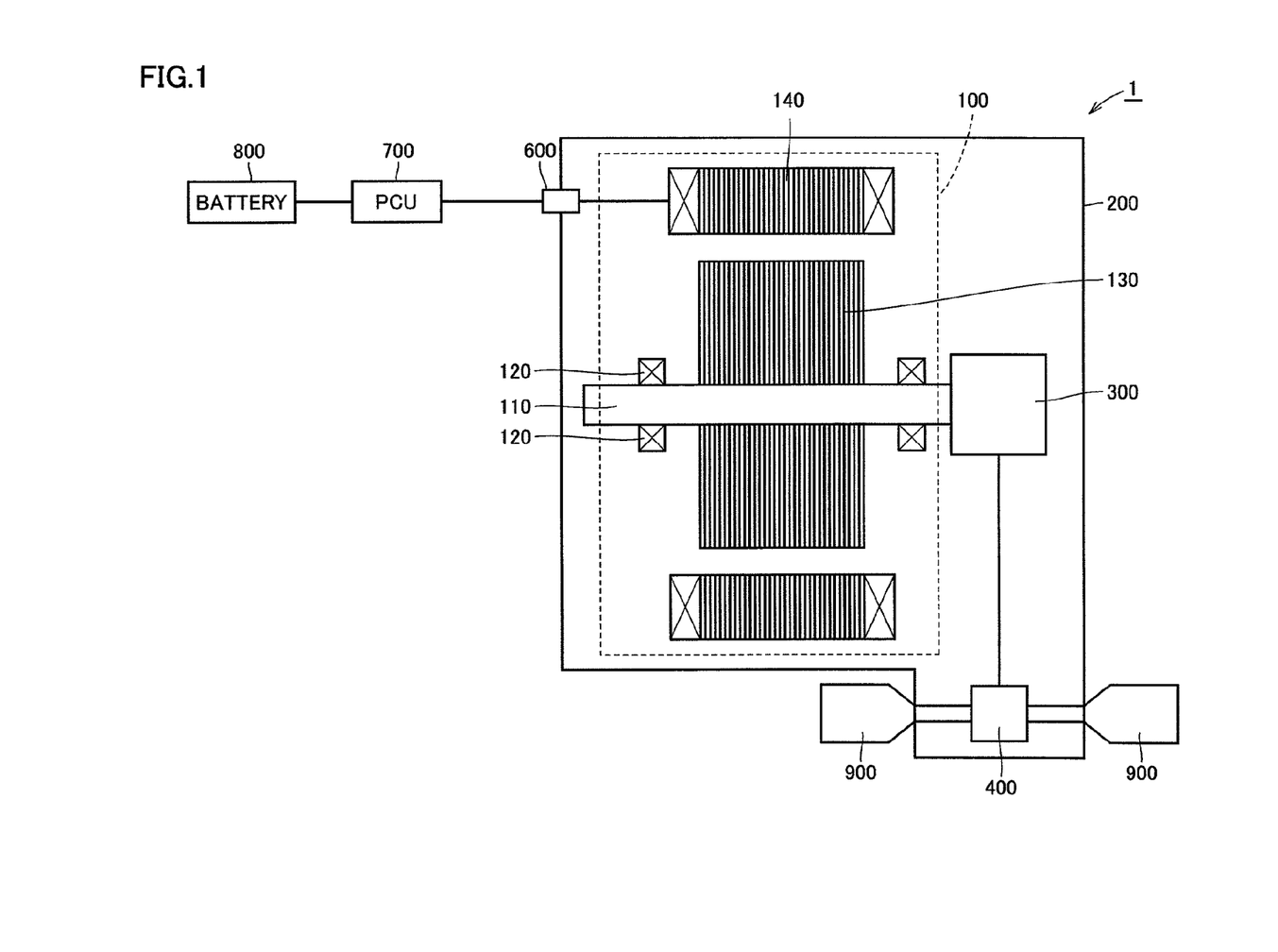
FIG. 1 is a schematic diagram showing an example of the structure of a drive unit of a vehicle according to the present embodiment.

FIG. 1 is a schematic diagram showing an example of the structure of a drive unit 1 of a vehicle according to the present embodiment. In the example shown in FIG. 1, drive unit 1 is a drive unit mounted on a hybrid vehicle and configured to include a motor generator 100, a housing 200, a speed-reduction mechanism 300, a differential mechanism 400, a drive shaft receiving portion 900, and a terminal block 600.

Motor generator 100 is a rotating electric machine having the function of an electric motor or an electric generator. Motor generator 100 includes a rotational shaft 110, a rotor 130, and a stator 140. Rotational shaft 110 is rotatably attached to housing 200 through a bearing 120. Rotor 130 rotates together with rotational shaft 110.

Motive power which is output from motor generator 100 is transmitted from speed-reduction mechanism 300 through differential mechanism 400 to drive shaft receiving portion 900. The driving power transmitted to drive shaft receiving portion 900 is transmitted in the form of rotational force through a drive shaft (not shown) to wheels (not shown) to cause the vehicle to run.

In contrast, when the hybrid vehicle is regeneratively braked, the wheels are rotated by the inertial force of the vehicle's body. The rotational force from the wheels causes motor generator 100 to be driven, through drive shaft receiving portion 900, differential mechanism 400, and speed-reduction mechanism 300. At this time, motor generator 100 operates as an electric generator. The electric power generated by motor generator 100 is transmitted through an inverter of a PCU 700 to a battery 800 and stored in battery 800.

Figure 2:
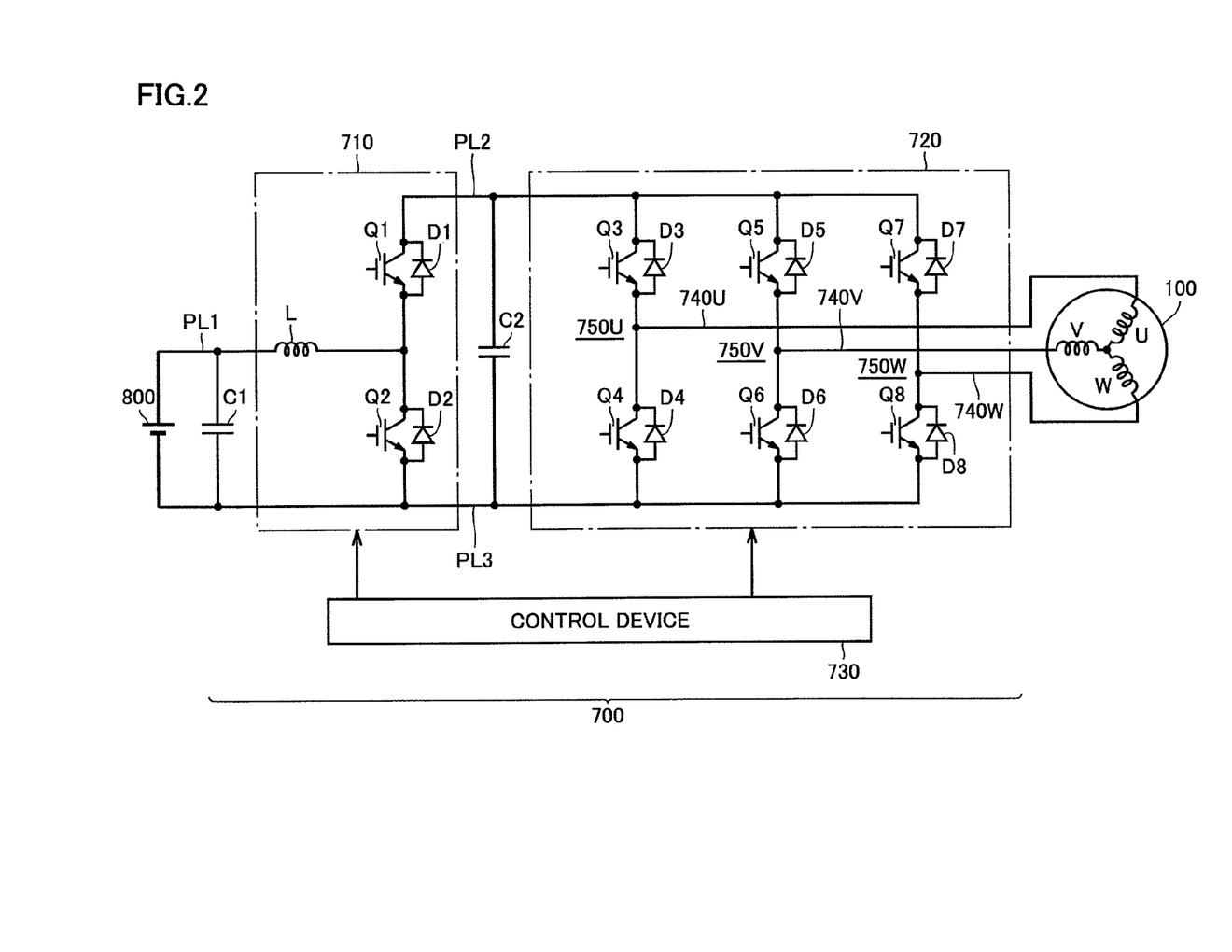
FIG. 2 is a circuit diagram showing a configuration of main components of a PCU 700 in FIG. 1.

FIG. 2 is a circuit diagram showing a configuration of main components of PCU 700 in FIG. 1. Referring to FIG. 2, PCU 700 includes a converter 710, an inverter 720, a control device 730, capacitors C1, C2, power supply lines PL1 to PL3, and output lines 740U, 740V, 740W.

Converter 710 is connected through power supply lines PL1, PL3 to battery 800. Converter 710 is connected between battery 800 and inverter 720. Inverter 720 is connected through power supply lines PL2, PL3 to converter 710. Inverter 720 is connected through output lines 740U, 740V, 740W to motor generator 100. Battery 800 is a DC power supply and formed for example of a secondary battery such as nickel-metal hydride battery or lithium ion battery. Battery 800 supplies DC power stored therein to converter 710, or is charged with DC power received from converter 710.

Converter 710 includes an upper arm and a lower arm each composed of a semiconductor module, and also includes a reactor L. The upper arm and the lower arm are connected in series between power supply lines PL2 and PL3. The upper arm connected to power supply line PL2 includes a power transistor (IGBT: Insulated Gate Bipolar Transistor) Q1 and a diode D1 connected in antiparallel with power transistor Q1. The lower arm connected to power supply line PL3 includes a power transistor Q2 and a diode D2 connected in antiparallel with power transistor Q2.

Power transistors Q1, Q2 are connected in series between power supply lines PL2 and PL3 and each have a base receiving a control signal from control device 730. Diodes D1, D2 are each connected between the collector and the emitter of power transistors Q1, Q2 to flow current from the emitter of power transistors Q1, Q2 toward the collector thereof. Reactor L has one end connected to power supply line PL1, which is connected to the positive electrode of battery 800, and the other end connected to the point where the upper arm and the lower arm are connected to each other.

Converter 710 receives a DC voltage from battery 800 and steps up the DC voltage by means of reactor L to supply the stepped-up voltage to power supply line PL2. Converter 710 receives a DC voltage from inverter 720 and steps down the DC voltage to charge battery 800.

Inverter 720 includes a U phase arm 750U, a V phase arm 750V, and a W phase arm 750W. U phase arm 750U, V phase arm 750V, and W phase arm 750W are connected in parallel between power supply lines PL2 and PL3. U phase arm 750U, V phase arm 750V, and W phase arm 750W are each made up of an upper arm and a lower arm which are each composed of a semiconductor module. The upper arm and the lower arm of each phase arm are connected in series between power supply lines PL2 and PL3.

The upper arm of U phase arm 750U includes a power transistor (IGBT) Q3 and a diode D3 connected in antiparallel with power transistor Q3. The lower arm of U phase arm 750U includes a power transistor Q4 and a diode D4 connected in antiparallel with power transistor Q4. The upper arm of V phase arm 750V includes a power transistor Q5 and a diode D5 connected in antiparallel with power transistor Q5. The lower arm of V phase arm 750V includes a power transistor Q6 and a diode D6 connected in antiparallel with power transistor Q6. The upper arm of W phase arm 750W includes a power transistor Q7 and a diode D7 connected in antiparallel with power transistor Q7. The lower arm of W phase arm 750W includes a power transistor Q8 and a diode D8 connected in antiparallel with power transistor Q8.

Diodes D3 to D8 are each connected between the collector and the emitter of the corresponding one of power transistors Q3 to Q8 to flow current from the emitter toward the collector of the corresponding one of power transistors Q3 to Q8. The point where the power transistors of each phase arm are connected to each other is connected to the end of the coil of the corresponding phase of motor generator 100 through the corresponding one of output lines 740U, 740V, 740W that is the end opposite to the neutral point of the coil.

While the upper arm and the lower arm of U phase arm 750U to W phase arm 750W are each shown to be composed of one semiconductor module made up of a power transistor and a diode, the upper and lower arms may each be composed of a plurality of semiconductor modules.

Capacitor C1 is connected between power supply lines PL1 and PL3 to smooth the voltage level of power supply line PL1. Capacitor C2 is connected between power supply lines PL2 and PL3 to smooth the voltage level of power supply line PL2.

Based on a control signal from control device 730, inverter 720 receives from power supply line PL2 a DC voltage smoothed by capacitor C2, and converts the received DC voltage into an AC voltage to output the AC voltage to motor generator 100. Inverter 720 rectifies an AC voltage generated by the regenerative operation of motor generator 100 into a DC voltage to output the DC voltage to power supply line PL2. Then, converter 710 receives from power supply line PL2 the DC voltage smoothed by capacitor C2, and steps down the received DC voltage to charge battery 800.

Control device 730 calculates the voltage of each phase coil of motor generator 100, based on the rotational angle of the rotor of motor generator 100, the motor torque command value, the value of each phase current of motor generator 100, and the input voltage of inverter 720. Based on the result of the calculation, control device 730 generates a PWM (Pulse Width Modulation) signal for turning on/off power transistors Q3 to Q8 to output the PWM signal to inverter 720. The value of each phase current of motor generator 100 is detected by a current sensor incorporated in the semiconductor module which forms each arm of inverter 720. The current sensor is arranged in the semiconductor module so that the S/N ratio is improved.

Control device 730 also calculates the duty ratio of power transistors Q1, Q2 for optimizing the input voltage of inverter 720, based on the aforementioned torque command value and the motor's rotational speed. Based on the result of the calculation, control device 730 generates a PWM signal for turning on/off power transistors Q1, Q2 to output the PWM signal to converter 710.

Further, control device 730 controls the switching operation of power transistors Q1 to Q8 of converter 710 and inverter 720 in order to convert the AC power generated by motor generator 100 into DC power and thereby charge battery 800.

PCU 700 includes reactor L as an electrical device of the present embodiment. Reactor L is disposed on the path through which electric power is supplied to inverter 720. Converter 710 including reactor L is mounted in a converter case, which serves as a storage case. Reactor L has one end connected to the power supply line of battery 800 and the other end connected to a middle point between power transistors Q1 and Q2 which are two IGBTs. When the gate of each IGBT is rendered on/off, vibration is generated from reactor L depending on the carrier frequency. This vibration transmitted to the vehicle will cause noise.

Figure 3:
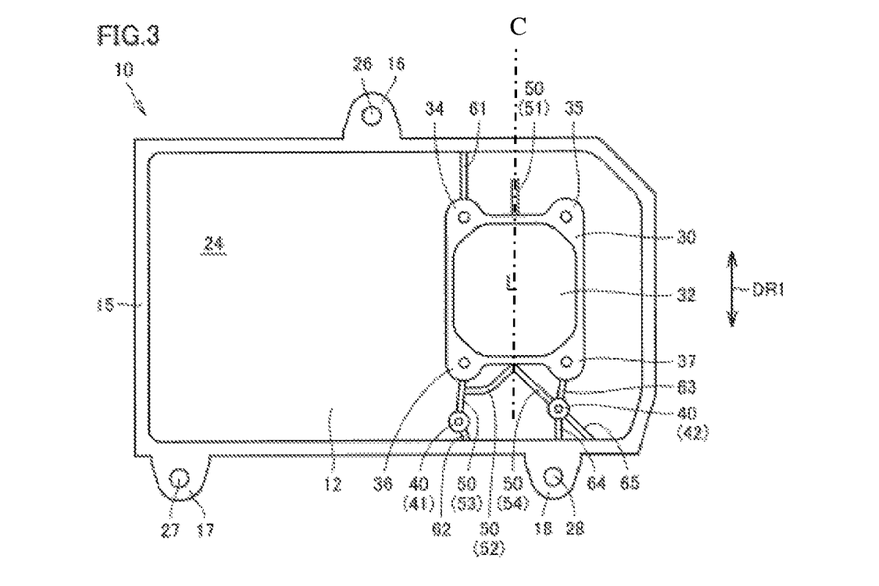
FIG. 3 is a plan view of a converter case.
Figure 4:
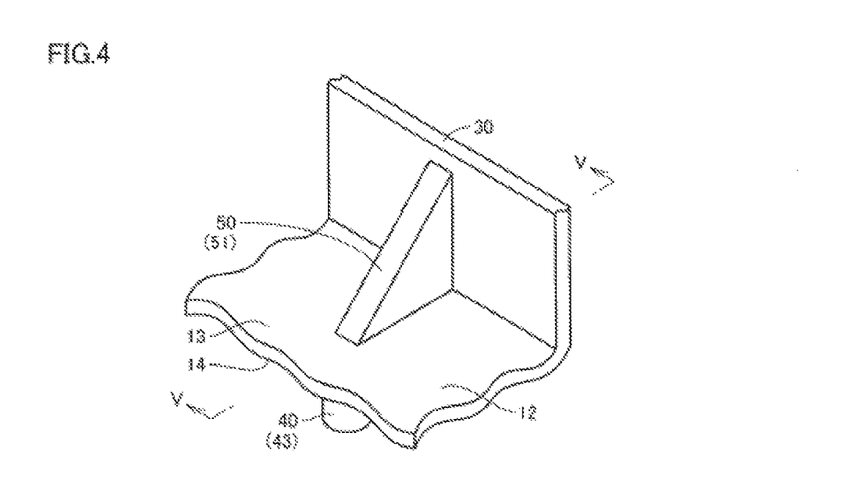
FIG. 4 is a perspective view showing a first rib and therearound in an enlarged form.
Figure 5:
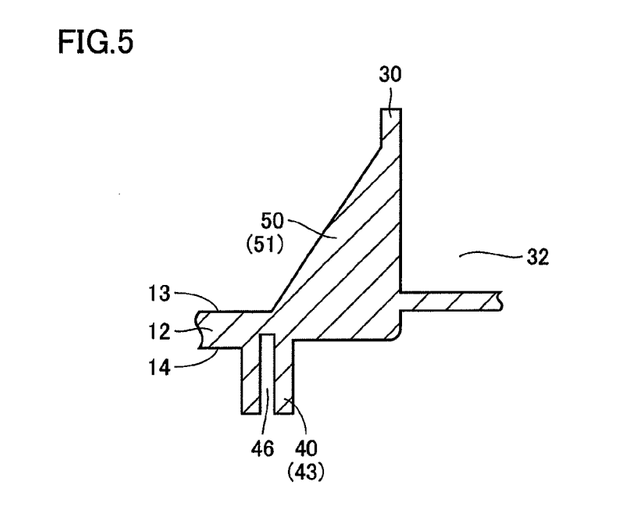
FIG. 5 is a cross-sectional view along line V-V shown in FIG. 4.
Figure 6:
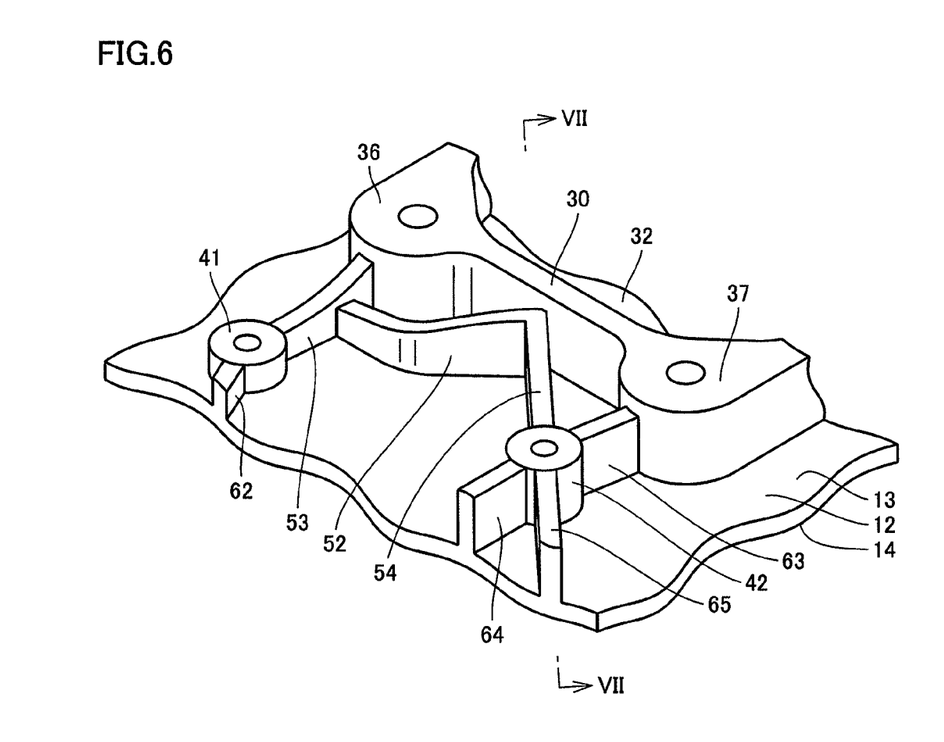
FIG. 6 is a perspective view showing second ribs and therearound in an enlarged form.
Figure 7:
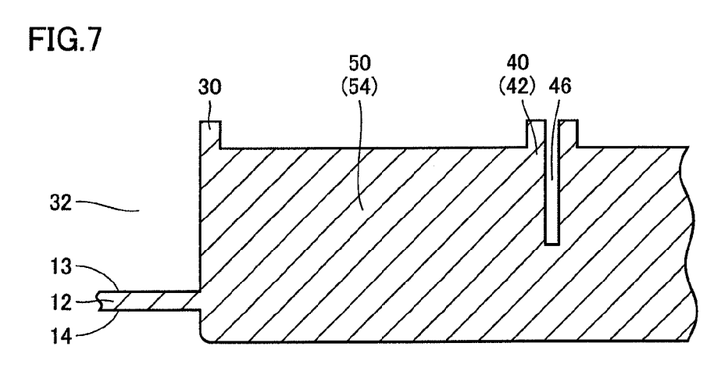
FIG. 7 is a cross-sectional view along line VII-VII shown in FIG. 6.

Next, a housing of an electronic device in the present embodiment will be described in detail. FIG. 3 is a plan view of a converter case 10. FIG. 4 is a perspective view showing a rib 51, which is a first rib, and therearound in an enlarged form. FIG. 5 is a cross-sectional view along line V-V shown in FIG. 4. FIG. 6 is a perspective view showing ribs 52 to 54, which are second ribs, and therearound in an enlarged form. FIG. 7 is a cross-sectional view along line VII-VII shown in FIG. 6. Referring to FIGS. 3 to 7 as required, a configuration of a housing of an electrical device will be described.

Converter case 10 is a housing which encases various electrical devices constituting converter 710 shown in FIG. 2. Converter case 10 has a base 12 on which the electrical devices are to be mounted. Base 12 is formed in the shape of a flat plate and has a front surface 13 and a rear surface 14 on the opposite side to front surface 13. In FIG. 3, the front surface 13 side of base 12 is shown. The electrical devices constituting converter 710 are mounted on front surface 13 of base 12. Converter case 10 has a reactor case 30 which surrounds reactor L shown in FIG. 2, and a substrate mount 24 on which an electrical substrate, which is equipped with power transistors Q1, Q2 and diodes D1, D2 shown in FIG. 2, is to be mounted.

Converter case 10 has an outer wall 15 formed to extend along the perimeter of the converter case and to protrude from front surface 13. Converter case 10 as seen in a plan view is substantially rectangular in shape. One of the longer sides of the rectangular shape (the upper side as seen in FIG. 3) has a fastening portion 16 provided to extend outward of converter case 10. The other longer side of the rectangular shape (the lower side as seen in FIG. 3) has a pair of fastening portions 17, 18 provided to extend outward of converter case 10. In fastening portion 16, a through hole 26 extending in the thickness direction through fastening portion 16 is formed. In fastening portion 17, a through hole 27 extending in the thickness direction through fastening portion 17 is formed. In fastening portion 18, a through hole 28 extending in the thickness direction through fastening portion 18 is formed.

Through the through holes 26 to 28 formed in fastening portions 16 to 18 respectively, bolts (not shown) are passed and fastened to another member, so that converter case 10 can be secured to the another member. Converter case 10 is thus secured to the another member through a securing tool which is typically a bolt. Converter case 10 is disposed for example in an engine room inside the body of the vehicle.

Reactor case 30 is erected from front surface 13 of base 12. Reactor case 30 is in the shape of an annular wall, and an encasing space 32 in which reactor L is encased is formed inside the annular wall. Reactor case 30 is structured as a surrounding wall which surrounds the outer periphery of reactor L. Reactor case 30 has its top opened so that a potting resin for securing and cooling reactor L can be fed into encasing space 32 after reactor L is placed in encasing space 32.

Reactor case 30 as seen in a plan view is substantially rectangular in shape. The vertices of the rectangular shape of reactor case 30 are equipped with terminals 34 to 37 for electrically connecting reactor L to the outside. Terminals 34 to 37 are formed to protrude outward of reactor case 30 and toward outer wall 15 of converter case 10. Reactor case 30 is placed in the substantially rectangular space surrounded by outer wall 15 of converter case 10 and located to be relatively closer to one of the shorter sides of the rectangular shape. Reactor case 30 is placed on base 12 in such a manner that the direction of the longer sides of reactor case 30 goes along the direction of the shorter sides of converter case 10.

Base 12 of converter case 10 is equipped with bosses 41, 42 located outside reactor case 30 and formed by protrusions of base 12 from front side 13, and a boss 43 located outside reactor case 30 and formed by a protrusion of base 12 from rear side 14. Bosses 41 to 43 are formed in such a manner that increases the dimension in the thickness direction of a part of base 12. Bosses 41 to 43 are provided in such a manner that base 12 is partially protruded in the thickness direction of base 12. Plate-like base 12 is equipped with bosses 41 to 43 which are erected so that they protrude in the top-bottom direction. A plurality of bosses 41 to 43 are formed integrally with base 12.

Bosses 41, 42 are provided to protrude from front surface 13 of base 12 in order to fasten and secure a bus bar. Boss 43 is provided to protrude from rear surface 14 of base 12 in order to fasten and secure a cooler. As shown in FIGS. 5 and 7, bosses 41 to 43 each have a fastening hole 46 formed to serve as a hole in which a screw is to be inserted. The inner surface of fastening hole 46 is inner-threaded. A bolt (not shown) is screwed in this fastening hole 46 to thereby fasten the bus bar to bosses 41, 42 and fasten the cooler to boss 43.

As compared with the portion of base 12 that is located around bosses 41 to 43 and relatively smaller in the dimension in the thickness direction than bosses 41 to 43, the portions of base 12 that are located at bosses 41 to 43 have a higher stiffness. Bosses 41 to 43 are each structured to serve as a reinforcing portion 40 configured to increase the stiffness of base 12.

In order to reinforce flat-plate-shaped base 12, a rib 50 placed at a right angle to front surface 13 of base 12 is formed. Rib 50 includes a plurality of ribs 51 to 54. Rib 51 couples a part of front surface 13 of base 12 that is located at the position where boss 43 is provided to protrude from rear surface 14, and the outer periphery of reactor case 30. Ribs 52, 53 couple boss 41 and the outer periphery of reactor case 30. Rib 54 couples boss 42 and the outer periphery of reactor case 30. Rib 50 may be formed to have a thickness for example of 2 mm.

Front surface 13 of base 12 is also equipped with a rib 61 erected to couple reactor case 30 and outer wall 15 of converter case 10, a rib 62 erected to couple boss 41 and outer wall 15, a rib 63 erected to couple reactor case 30 and boss 42, and ribs 64, 65 erected to couple boss 42 and outer wall 15.

The outer peripheral surface of reactor case 30 and a part of front surface 13, which is located at the position where boss 43 serving as reinforcing portion 40 increasing the stiffness of base 12 is formed on rear surface 14, are coupled to each other by rib 51. Further, the outer peripheral surface of reactor case 30 and bosses 41, 42 each serving as reinforcing portion 40 increasing the stiffness of base 12 are coupled to each other by ribs 52 to 54. Accordingly, bosses 41 to 43 which are relatively thick and less likely to vibrate and reactor case 30 are coupled together by ribs 51 to 54, so that the stiffness of reactor case 30 surrounding reactor L can be improved.

Since reactor case 30 has the increased stiffness, vibration of reactor case 30, which occurs when vibration generated from reactor L is transmitted to reactor case 30, can be reduced. The vibration transmitted to reactor case 30 is absorbed by bosses 41 to 43 so that the vibration is attenuated before being transmitted from reactor case 30 to converter case 10.

Therefore, transmission of the vibration of reactor case 30 to converter case 10 and further to an external device through fastening portions 16 to 18 of converter case 10 can be suppressed. Even when reactor L which generates vibration while operating is encased in converter case 10 and mounted on a vehicle, vibration and noise caused by the vibration of reactor L can be suppressed and therefore the vibration and noise can be prevented from being propagated to the passenger compartment and making any passenger therein uncomfortable. Thus, the driver of the vehicle can operate the vehicle with comfort. In addition, it is unnecessary to provide an anti-vibration bushing made of rubber for suppressing transmission of vibration from converter case 10 to an external device, and therefore, the anti-vibration bushing can be dispensed with and thus the cost of the vehicle can be reduced.

Converter case 10, reactor case 30, and rib 50 can be molded integrally by means of casting such as aluminum die casting. Because of the restriction imposed by the aluminum casting, reactor case 30 is molded to have a small plate thickness for example of 3 mm or less. Reactor case 30 molded to be relatively thinner accordingly has a lower stiffness. However, rib 50 can be provided for the sake of reinforcement in accordance with the present embodiment to improve the stiffness of reactor case 30 and effectively reduce vibration of reactor case 30.

Here, bosses 41 to 43 serving as reinforcing portions 40 to which ribs 50 are coupled are originally intended to fasten a cooler or bus bar. No reinforcing portion 40 is newly provided to base 12 of converter case 10. With attention directed to the fact that the stiffness of base 12 is enhanced at bosses 41 to 43 which are originally provided for another purpose, reactor case 30 and bosses 41 to 43 are coupled to each other by ribs 50 to thereby improve the stiffness of reactor case 30. In this way, the stiffness of reactor case 30 can be improved effectively with the simple configuration.

A double-headed arrow DR1 shown in FIG. 3 indicates a direction along which reactor L vibrates. Ribs 50 can be provided to extend along the direction of vibration of reactor L to more effectively suppress vibration of reactor case 30 resultant from vibration of reactor L. On the upper side of the outer periphery of reactor case 30 as shown in FIG. 3, rib 51 is placed as a first rib and, on the lower side of the outer periphery of reactor case 30 as shown in FIG. 3, ribs 52 to 54 are placed as second ribs. Ribs 50 are formed to extend outward of reactor case 30 from respective parts of reactor case 30 that are opposite to each other with respect to the direction of vibration of reactor L. Ribs 50 are used on both sides with respect to the direction of vibration of reactor L so as to reinforce reactor case 30, which can accordingly suppress vibration of reactor case 30 still more effectively.

Boss 43 is placed at the position with respect to which one side and the other side of reactor case 30 are equal two parts along the direction orthogonal to the direction of vibration of reactor L shown in FIG. 3. With reactor L placed in encasing space 32, boss 43 is placed on a center line C of reactor L. Boss 43 placed in this manner can be used to allow I-shaped rib 51 to extend linearly along the direction of vibration of reactor L, and thereby effectively improve the stiffness of reactor case 30. In contrast, bosses 41, 42 are placed at respective positions out of the central portion of reactor L with respect to the direction orthogonal to the direction of vibration of reactor L. With respect to the direction orthogonal to the direction of vibration of reactor L shown in FIG. 3, bosses 41, 42 are placed separately from each other on respective sides opposite to each other relative to the position with respect to which one side and the other side of reactor case 30 are equal two parts. Bosses 41, 42 placed in this manner can be used to allow V-shaped ribs 52 to 54 to be formed to extend from the central portion of reactor L in two directions and thereby effectively improve the stiffness of reactor case 30.

Figure 8:
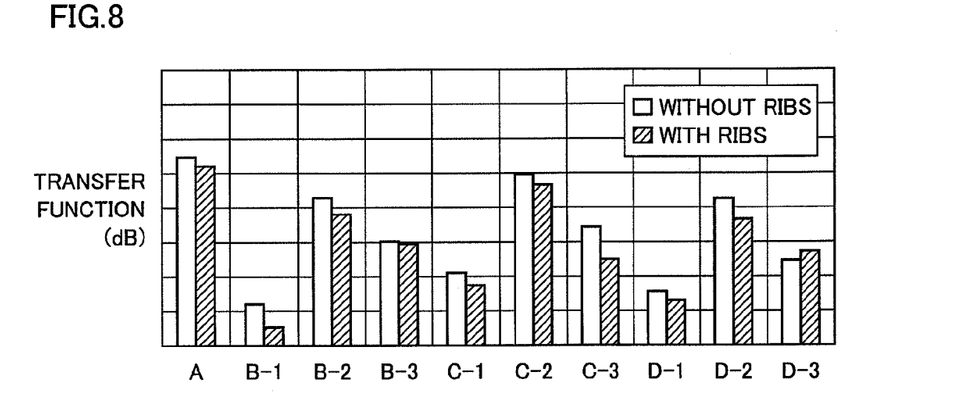
FIG. 8 is a graph illustrating a vibration reducing effect achieved by ribs of the present embodiment.

FIG. 8 is a graph illustrating a vibration reducing effect produced by ribs 51 to 54 of the present embodiment. A vibration frequency of 9.55 kHz of the reactor during energization of the reactor was simulated in the following way. The outer peripheral surface of the side of reactor case 30 where rib 51 was placed was hit with a hammer (hammering), and the vibration at this time was measured. In order to clarify the effect of reducing vibration by ribs 51 to 54, the value of measurement for reactor case 30 to which ribs 51 to 54 are not coupled and that for reactor case 30 to which ribs 51 to 54 are coupled are plotted next to each other in the graph shown in FIG. 8. A blank bar shown in FIG. 8 represents the case where ribs 51 to 54 are absent and an obliquely hatched bar shown in FIG. 8 represents the case where ribs 51 to 54 are present.

On the horizontal axis shown in FIG. 8, there are indicated points of converter case 10 where vibration was measured, namely a point of vibration where vibration was caused through hammering (point A), as well as fastening portion 18 (point B), fastening portion 16 (point C), and fastening portion 17 (point D) of converter case 10. As to item A indicated on the horizontal axis, the bars of item A each represent the value of forward-backward vibration at point A (point of vibration). As to item B-1, the bars of item B-1 each represent the value of upward-downward vibration at point B (fastening portion 18). As to item B-2, the bars of item B-2 each represent the value of rightward-leftward vibration at point B. As to item B-3, the bars of item B-3 each represent the value of forward-backward vibration at point B. Items C-1 to C-3 and D-1 to D-3 are similar to aforementioned items B-1 to B-3.

Here, the aforementioned upward-downward direction is the direction of the thickness of base 12 (namely the direction perpendicular to the plane of FIG. 3). The aforementioned rightward-leftward direction is the rightward-leftward direction of the vehicle and the direction orthogonal to the direction of vibration of reactor L indicated by double-headed arrow DR1 in FIG. 3 (namely the rightward-leftward direction as seen in FIG. 3). The aforementioned forward-backward direction is the forward-backward direction of the vehicle and the direction of vibration of reactor L indicated by double-headed arrow DR1 (namely the upward-downward direction as seen in FIG. 3).

The vertical axis shown in FIG. 8 represents the transfer function (unit: dB) of vibration at each point that is obtained by measuring the acceleration at each point with an accelerometer placed at points A to D each.

As shown in FIG. 8, from a comparison, for each point in converter case 10, between the value of transfer function in the case where ribs 51 to 54 are present and that where ribs 51 to 54 are absent, it is seen that generally the value of transfer function in the case where ribs 51 to 54 are present is smaller. Namely, ribs 51 to 54 are provided to thereby suppress transmission of vibration, which is generated from reactor L, through reactor case 30 to the outside. It has therefore been proved that converter case 10 of the present embodiment produces the effect of reducing vibration which is generated while reactor L is operating, and accordingly generation of noise can be suppressed.

While the foregoing description has been given in connection with an example where I-shaped rib 51 extends from one side, in the direction of vibration of reactor L, of reactor case 30 and V-shaped ribs 52 to 54 extend from the other side of reactor case 30, the shapes of the ribs are not limited to them. As long as the rib is configured to couple the outer peripheral surface of reactor case 30 and reinforcing portion 40 which is placed outside reactor case 30 to increase the stiffness of base 12, the rib may have any shape.

Reinforcing portion 40 is not limited to bosses 41 to 43. Any boss formed to protrude from front surface 13 or rear surface 14 of base 12 of converter case 10 may be used as reinforcing portion 40. Further, for example, outer wall 15 of converter case 10 may be used as reinforcing portion 40 and a rib coupling reactor case 30 and outer wall 15 may be provided. It should be noted, however, in terms of reduction of the material for forming rib 50, it is desirable to form a rib extending from a boss which is located relatively closer to reactor case 30.

The shapes of the ribs extending from one side and the other side with respect to the direction of vibration of reactor L may be varied as appropriate depending on how reinforcing portions 40 are arranged. Therefore, the shapes of the ribs are not limited to I-shaped rib 51 and V-shaped ribs 52 to 54 described above in connection with the embodiment. For example, a pair of I-shaped ribs, V-shaped ribs, or ribs of any other shape may be provided so that one of the ribs extends from one side of reactor case 30 and the other extends from the other side opposite to the one side of reactor case 30.

Moreover, the foregoing description has been given in connection with an example configuration of converter case 10 for reducing vibration generated from reactor L mounted on a hybrid vehicle. The scope of the present invention, however, is not limited to this. The electrical device applied to the present invention may be any device and the electrical device may or may not be adapted to be mounted on a vehicle.

While the embodiment of the present invention has been described above, it should be construed that the embodiment and examples disclosed herein are by way of illustration in all respects, not by way of limitation. It is intended that the scope of the present invention is defined by claims, not by the description above, and encompasses all modifications and variations equivalent in meaning and scope to the claims.

INDUSTRIAL APPLICABILITY

The housing of an electrical device in accordance with the present invention is applicable particularly advantageously to a housing which encases a reactor included in a drive unit mounted on an electrically-powered vehicle and configured to boost the voltage.

REFERENCE SIGNS LIST 10 converter case; 12 base; 13 front surface; 14 rear surface; 15 outer wall; 30 reactor case; 32 encasing space; 40 reinforcing portion; 41, 42, 43 boss; 50, 51, 52, 53, 54 rib; 710 converter; L reactor

The invention claimed is:

1. A housing of an electrical device, the housing encasing the electrical device which generates vibration while operating, the housing comprising:
   a plate-shaped base having a front surface and a rear surface, said electrical device being to be mounted on said front surface;
   a surrounding wall erected from said front surface of said base and surrounding an outer periphery of said electrical device;
   a plurality of bosses provided outside said surrounding wall and formed by a point-like protrusion of said base, said plurality of bosses including a front-surface boss protruding from said front surface and a rear-surface boss protruding from said rear surface; and
   a plurality of ribs including a first rib coupling said surrounding wall and said front-surface boss to each other and a second rib coupling said surrounding wall and said front surface of said base to each other at a position directly opposite to where said rear-surface boss is formed on said rear surface of said base.

2. The housing of an electrical device according to claim 1, wherein at least one of said plurality of ribs extends along a direction of vibration of said electrical device.

3. The housing of an electrical device according to claim 1, wherein said rear-surface boss is placed on a center line of said electrical device with respect to a direction orthogonal to a direction of vibration of said electrical device.

4. The housing of an electrical device according to claim 1, wherein said plurality of ribs are formed to extend respectively from portions of said surrounding wall that are opposite to each other.

5. The housing of an electrical device according to claim 1, wherein said electrical device is a reactor mounted on a vehicle.

* * * * *